US008587385B2

(12) United States Patent
Umeda

(10) Patent No.: US 8,587,385 B2
(45) Date of Patent: Nov. 19, 2013

(54) PRINTED WIRING BOARD AND DEVICE INCLUDING PRINTED WIRING BOARD

(75) Inventor: Kengo Umeda, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 396 days.

(21) Appl. No.: 12/965,792

(22) Filed: Dec. 10, 2010

(65) Prior Publication Data

US 2011/0279189 A1 Nov. 17, 2011

(30) Foreign Application Priority Data

May 14, 2010 (JP) ................................ 2010-112329

(51) Int. Cl.
*H01P 3/08* (2006.01)
*H03H 7/38* (2006.01)

(52) U.S. Cl.
USPC ................................................. 333/5; 333/33

(58) Field of Classification Search
USPC ................................ 333/1, 4, 5, 33, 238, 246
See application file for complete search history.

(56) References Cited

U.S. PATENT DOCUMENTS

| 4,424,500 A * | 1/1984 | Viola et al. .................... 333/128 |
| 2003/0095014 A1* | 5/2003 | Lao et al. ........................ 333/33 |

FOREIGN PATENT DOCUMENTS

| CN | 101346040 A | 1/2009 |
| JP | 05-299909 A | 11/1993 |
| JP | 07-321463 A | 12/1995 |
| JP | 2004-014800 A | 1/2004 |

OTHER PUBLICATIONS

PCB and electromagnetic compatibility design, Mar. 3, 2006.

* cited by examiner

*Primary Examiner* — Stephen Jones
(74) *Attorney, Agent, or Firm* — Canon USA, Inc., IP Division

(57) ABSTRACT

A printed wiring board includes a first terminal array and a second terminal array comprising a plurality of terminals, a first differential signal line connecting a first terminal of the first terminal array to a predetermined number of terminals including a second terminal of the second terminal array, a second differential signal line connecting a third terminal of the first terminal array to a number of terminals including a fourth terminal of the second terminal array, which is bigger than the predetermined number of terminals wherein at least one of a line width and a line interval of one pair signal lines configuring the first differential signal line and the second differential signal line is determined so that differential impedance of the second differential signal line becomes higher compared with differential impedance of the first differential signal line.

7 Claims, 8 Drawing Sheets

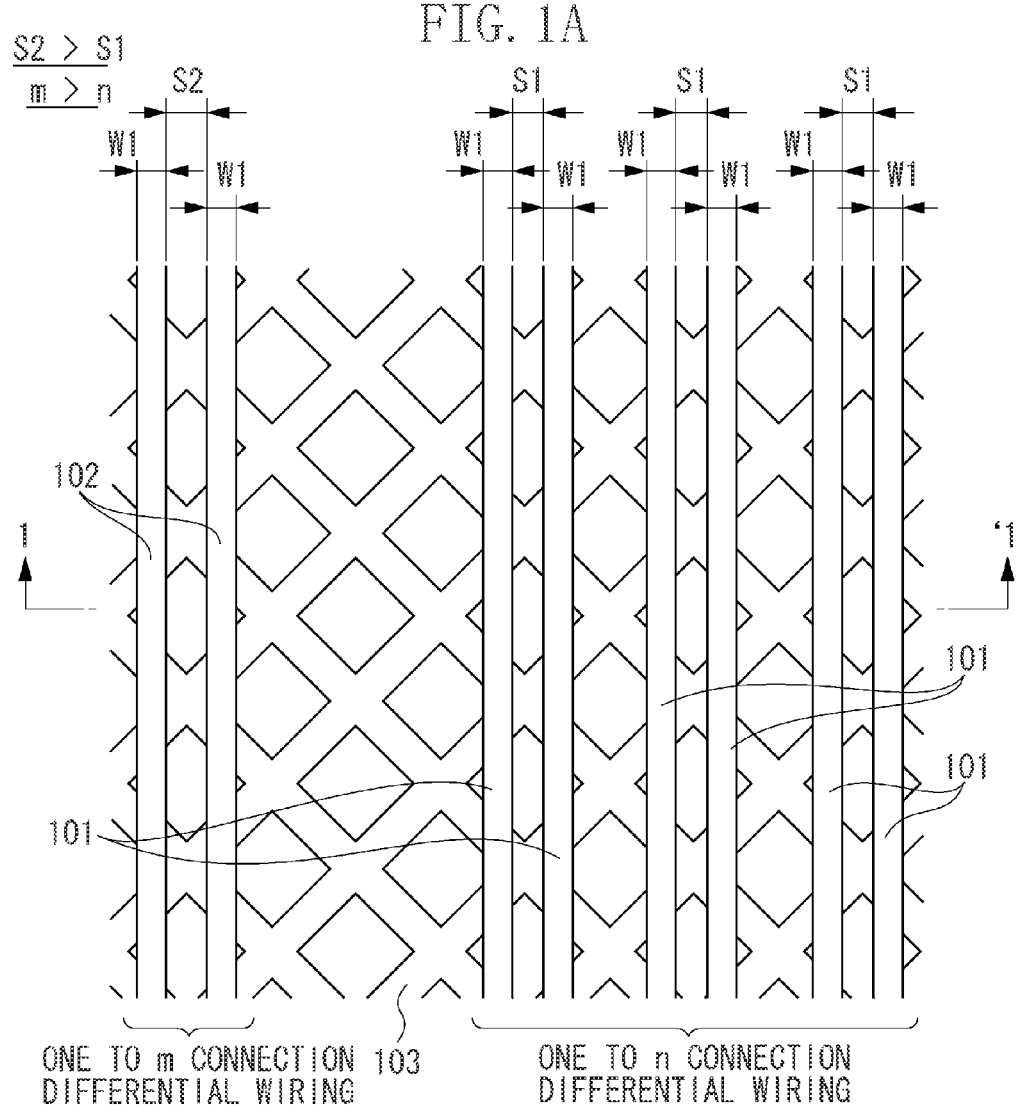
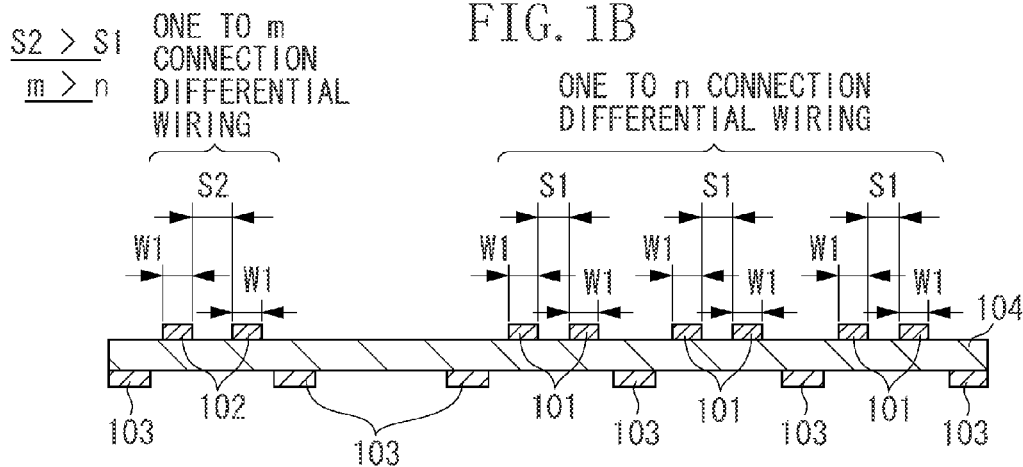

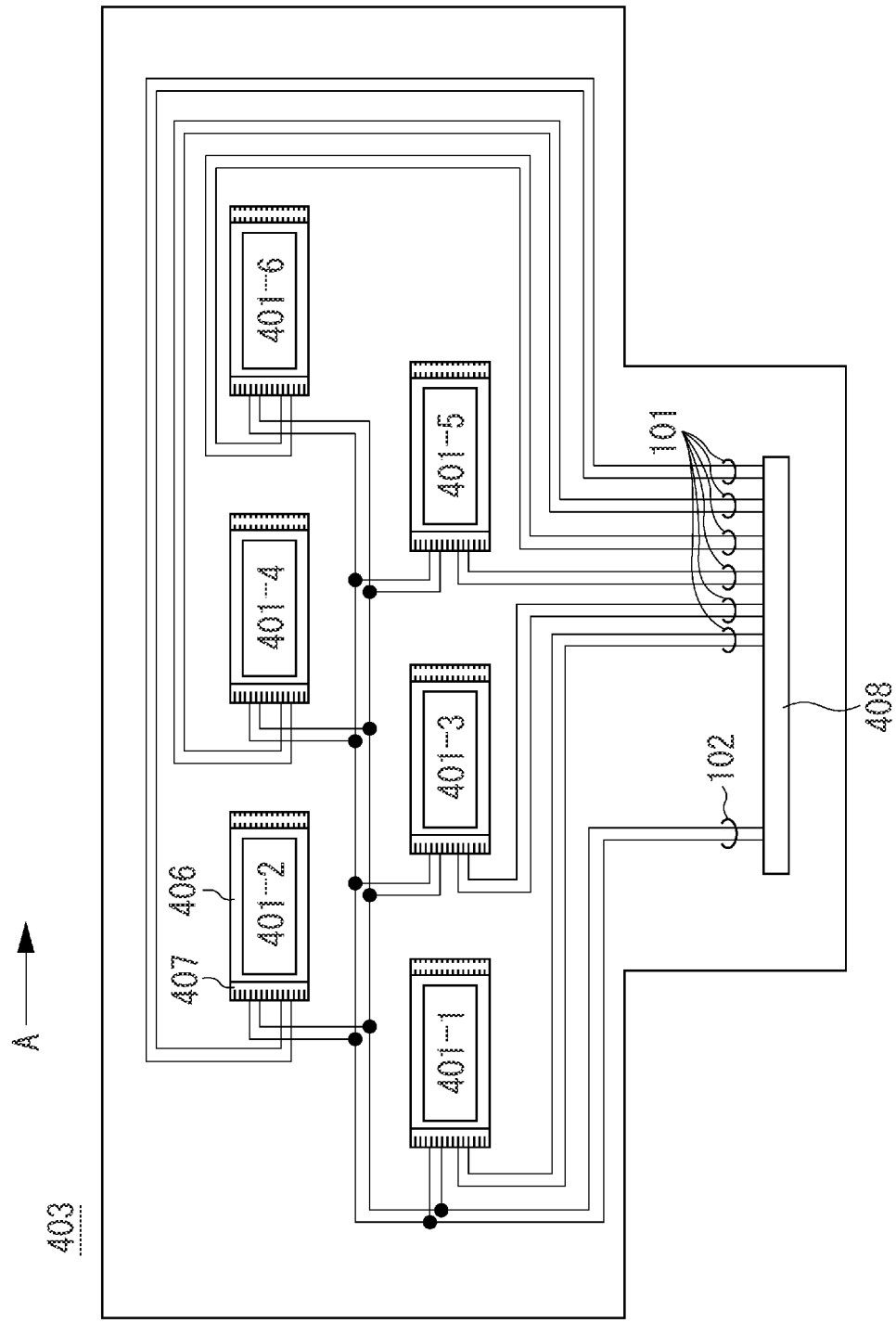

PRINTED WIRING BOARD AND DEVICE INCLUDING PRINTED WIRING BOARD

BACKGROUND OF THE INVENTION

1. Field of the Invention

The present invention relates to a printed wiring board having a differential signal line and a device including the printed wiring board.

2. Description of the Related Art

A printed wiring board having a thin insulation layer, such as a flexible board, has been used in a device (an electronic device). Japanese Patent Application Laid-Open No. 7-321463 discusses a technology which realizes necessary characteristic impedance by providing a ground line having a mesh shape on a printed wiring board. In this method, capacitance C of the signal line is suppressed without largely narrowing a width of the signal line.

However, Japanese Patent Application Laid-Open No. 7-321463 does not discuss an impedance design considering a connection form of a signal line, e.g., connection of 1 to 1 or 1 to a plurality. In a printed board, various signal lines are connected to a circuit (aboard). A plurality of terminals is provided on the circuit (the board) for connecting other circuits. In such a plurality of terminals, it is conceivable that the terminals include a connection form of 1 to 1 and a connection form of 1 to a plurality. Further, it is also conceivable that in such a plurality of terminals, a connection form of 1 to n and a connection form of 1 to m are included. Further, in such a configuration, if only a signal line of part of connection forms is matched to a termination resistor but a signal line of other connection forms cannot be matched to the termination resistor, reflection of a signal or a wave form distortion occur. As the result of this, a quality of signal transmission to a circuit (a board) decreases.

SUMMARY OF THE INVENTION

According to an aspect of the present invention, a printed wiring board includes a first terminal array and a second terminal array, a first differential signal line connecting a first terminal of the first terminal array to a predetermined number of terminals including a second terminal of the second terminal array, a second differential signal line connecting a third terminal of the first terminal array to a number of terminals including a fourth terminal of the second terminal array, which is bigger than the predetermined number of terminals wherein at least one of a line width and a line interval of one pair signal lines configuring the first differential signal line and the second differential signal line is determined so that differential impedance of the second differential signal line becomes higher compared with differential impedance of the first differential signal line.

Further features and aspects of the present invention will become apparent from the following detailed description of exemplary embodiments with reference to the attached drawings.

BRIEF DESCRIPTION OF THE DRAWINGS

The accompanying drawings, which are incorporated in and constitute a part of the specification, illustrate exemplary embodiments, features, and aspects of the invention and, together with the description, serve to explain the principles of the invention.

FIGS. 1A and 1B illustrate wiring of a printed wiring board according to a first exemplary embodiment.

FIG. 2 illustrates a printed wiring board in exemplary embodiments.

DESCRIPTION OF THE EMBODIMENTS

Figure 3A:
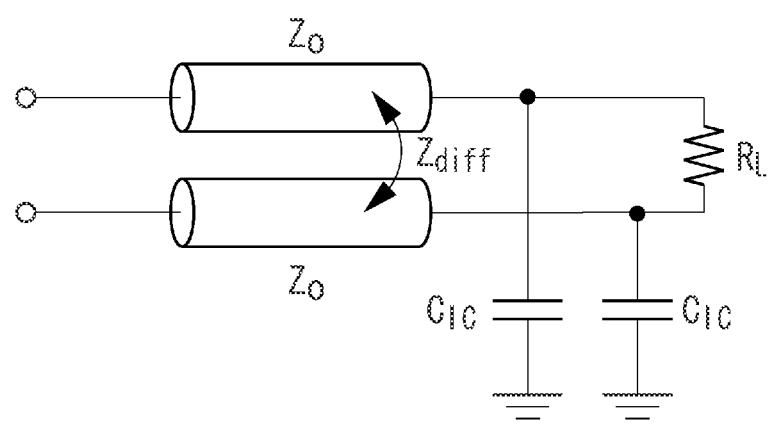
FIGS. 3A and 3B illustrate an equivalent circuit of a differential signal line.

Various exemplary embodiments, features, and aspects of the invention will be described in detail below with reference to the drawings.

FIG. 1 illustrates a printed wiring board according to the first exemplary embodiment. FIG. 1A is an expanded plane view and FIG. 1B is a cross sectional view taken along dotted line 1 to '1 in FIG. 1A. In a printed wiring board, on one surface of an insulation layer 104, a differential signal line 101 and a differential signal line 102, which are configured with one pair signal lines, are provided. A ground signal line 103 is provided on another surface of the insulation layer 104.

The printed wiring board is configured with the differential signal line 101 having a 1 to n connection form (n is an integer equal to or bigger than 1), the differential signal line 102 having a 1 to m connection form, the ground line 103, and the insulation layer 104. In addition, m is bigger than n (n<m, m is an integer bigger than 2). The ground signal line 103 is formed in a mesh-like shape to obtain a differential impedance of a predetermined value even when a thickness of the insulation layer 104 is thin. Further, S1 indicates a wiring distance (wiring interval) of the differential signal line 101 having the 1 to n connection form, and S2 indicates a wiring distance (wiring interval) of the differential signal line 102 having the 1 to m connection form. W1 indicates a wiring width of both differential signal lines.

Using FIG. 2, a printed wiring board 403 on which the differential signal line 101 and the differential signal line 102 are provided will be described. The printed wiring board 403 includes six element substrates 401 (401-1 to 401-6). The differential signal line (the first differential line) 101 and the differential signal line (the second differential line) 102 are wired so as to connect terminals contained in the terminal array (the first terminal array) 408 to terminals contained in the terminal array (the second terminal array) 407. Further, terminals in the terminal array 407 are connected with terminals in the element substrate 401 by a wire bonding technology. Terminals in the terminal array 408 are connected with terminals of a control substrate (not illustrated) by a signal line or a connector. In addition, the element substrate 401 is a driving element substrate for driving a driving element such as a recording element, a light emitting element, and a sensor element. The control substrate controls the driving element. In each element substrate 401, a plurality of recording elements is arranged in the arrow A direction (a longitudinal direction).

The differential signal line 101 independently connects six element substrates 401 to terminals contained in the terminal array 408 respectively. In other words, the differential signal line 101 is a connection form of 1 to 1 and is, for example, a signal line for transmitting a data signal. On the other hand, the differential signal line 102 commonly connects six element substrates 401 and terminals contained in the terminal array 408. In other words, the differential signal line 102 is a connection form of 1 to a plurality and is, for example, a signal line for transmitting a clock signal.

Figure 3B:
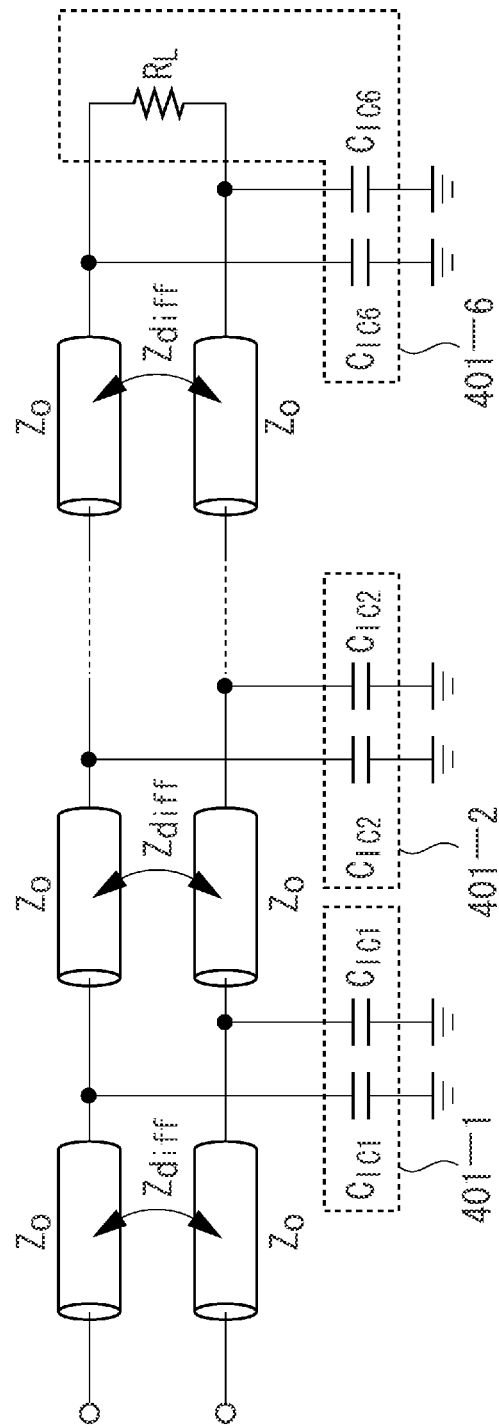

Using FIG. 3, an equivalent circuit of a differential signal line will be described. FIG. 3A illustrates an equivalent circuit of the differential signal line 101. FIG. 3B illustrates an equivalent signal circuit of the differential signal line 102. $Z_o$ indicates characteristic impedance of a single end of a differential signal line, $Z_{diff}$ indicates a differential impedance of a differential signal line, $C_{IC}$ indicates an input electrostatic capacity (capacitance) of an element substrate, and $R_L$ indicates a termination resistor. Further, in FIG. 3B, $C_{IC1}$ to $C_{IC6}$ indicate input capacity of the element substrates 401-1 to 401-6. $Z_o$ and $Z_{diff}$ are indicated by the following formulas respectively.

$$Z_O = \sqrt{\frac{L}{C}} \quad (1)$$

$$Z_{diff} = 2Z_O(1 - 0.48e^{-0.96\frac{S}{h}}) \quad (2)$$

L is inductance per unit length, C is a electrostatic capacity (capacitance) per unit length, S is a wiring interval of a differential wiring, and h is a thickness of an insulation layer. To suppress reflection of a signal and distortion of a wave form, the differential impedance $Z_{diff}$ needs to be equal to the termination resistor $R_L$. Since the differential impedance $Z_{diff}$ is determined by the characteristic impedance $Z_o$ of a single end, $Z_o$ is determined so that $Z_{diff}$ is equal to $R_L$, which is generally 100Ω in a high speed signal transmission interface standard. $Z_o$ is determined by the inductance per unit length L and the capacitance per unit length C according to the formula (1), and is actually adjusted by a wiring width of a signal line. When the wiring width becomes thick, the capacitance C increases and the inductance L decreases, so that $Z_o$ becomes low. When the wiring width becomes thin, the capacitance C decreases and the inductance L increases, so that $Z_{diff}$ becomes high.

In the first exemplary embodiment, the differential impedance $Z_{diff}$ of the differential signal line 102 is set to be high beforehand compared with the differential impedance $Z_{diff}$ of the differential signal line of the differential signal line 101. For this purpose, a wiring size of the differential signal line 101 and a wiring size of the differential signal line 102 are determined. More specifically, a wiring interval S1 of the first differential signal line 101 and a wiring interval S2 of the second differential signal line 102 are determined so that the wiring interval S2 becomes larger than the wiring interval S1. As seen from formula (2), the wider a wiring distance (wiring interval) S, the higher the differential impedance $Z_{diff}$.

A case in which the present exemplary embodiment is not applied will be described. When $Z_o$ is determined so that $Z_{diff}$ is equal to a termination resistor of 100Ω, there is no problems in a case of the differential signal line 101 (n=1), but problems occur in a case of the differential signal line 102 (m=6). In a case of the differential signal line 102, since each input capacity of $C_{IC1}$ to $C_{IC6}$ of a plurality of element substrates is added as illustrated in FIG. 3B, the capacitance component C increases, and the actual $Z_O$ becomes lower than the designed $Z_O$. Accordingly, the actual $Z_{diff}$ becomes also lower than a designed $Z_{diff}$ of 100Ω, so that the signal line 102 cannot be matched to the termination resistor, and reflection of a signal and distortion of a wave form occur.

As described above, generations of reflection of a signal and distortion of a wave form can be suppressed by setting the differential impedance of the differential signal line having the 1 to m connection form to be higher than the differential impedance of the differential signal line having the 1 to n connection form (n<m).

Figure 4A:
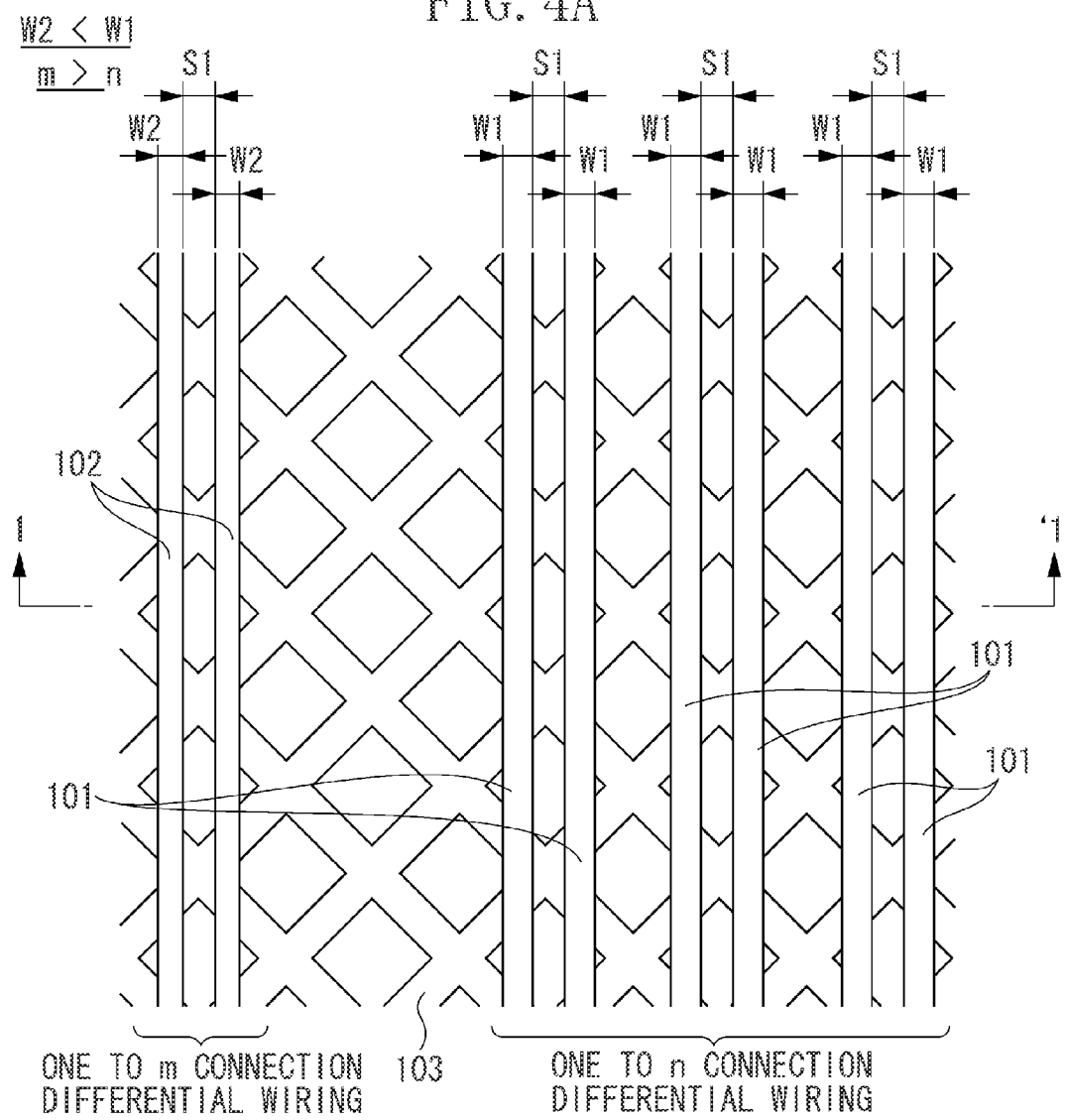
FIGS. 4A and 4B illustrate wiring of a printed wiring board according to a second exemplary embodiment.
Figure 4B:
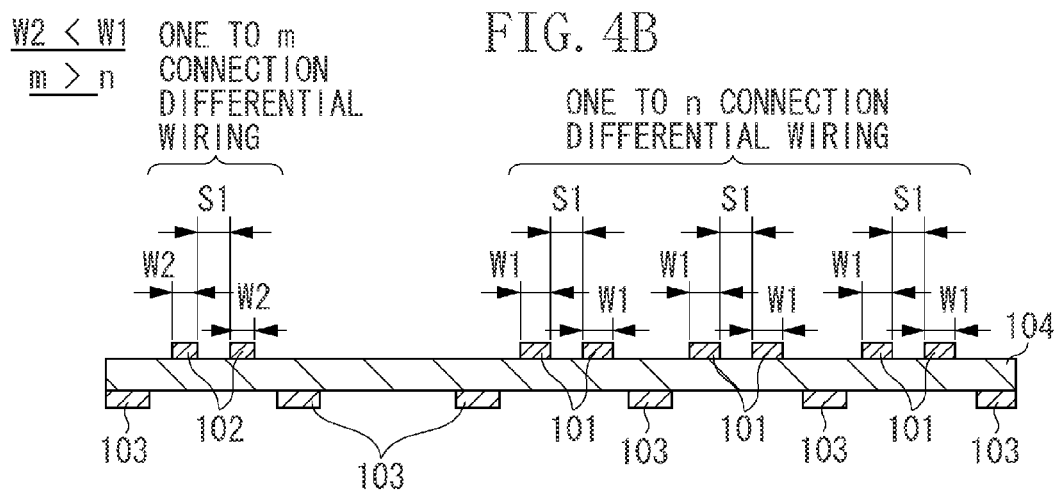

FIG. 4 illustrates a printed wiring board according to the second exemplary embodiment. FIG. 4A illustrates an expanded plane view and FIG. 4B is a cross sectional view taken along a dotted line 1-'1 in FIG. 4A. In the second exemplary embodiment, similarly as the first exemplary embodiment, the differential impedance of the differential signal line having the 1 to m connection form is set to be higher than the differential impedance of the differential signal line having the 1 to n connection form. Descriptions of similar parts of the first exemplary embodiment will be omitted and only different points will be described.

In the printed wiring board according to the second exemplary embodiment, a wiring width of the differential signal line 102 having the 1 to m connection form is set to be thinner than a wiring width of the differential signal line 101 having the 1 to n connection form. As described in the first exemplary embodiment, when a wiring width becomes thin, since the capacitance per unit length C decreases and the inductance per unit length L increases, as seen from the formula (1), the characteristic impedance $Z_O$ of a single end becomes high. By setting W2<W1, the characteristic impedance $Z_O$ of a single end of the signal line 102 can be higher compared with the characteristic impedance $Z_O$ of a single end of the signal line 101. Accordingly, as seen from the formula (2), since the differential impedance $Z_{diff}$ is determined by $Z_O$, the differential impedance $Z_{diff}$ of the signal line 102 having the 1 to m connection form can be set higher than the differential impedance $Z_{diff}$ of the signal line 101 having the 1 to n connection form.

Having the aforementioned configuration, reflection of a signal and distortion of a wave form can be suppressed.

Figure 5A:
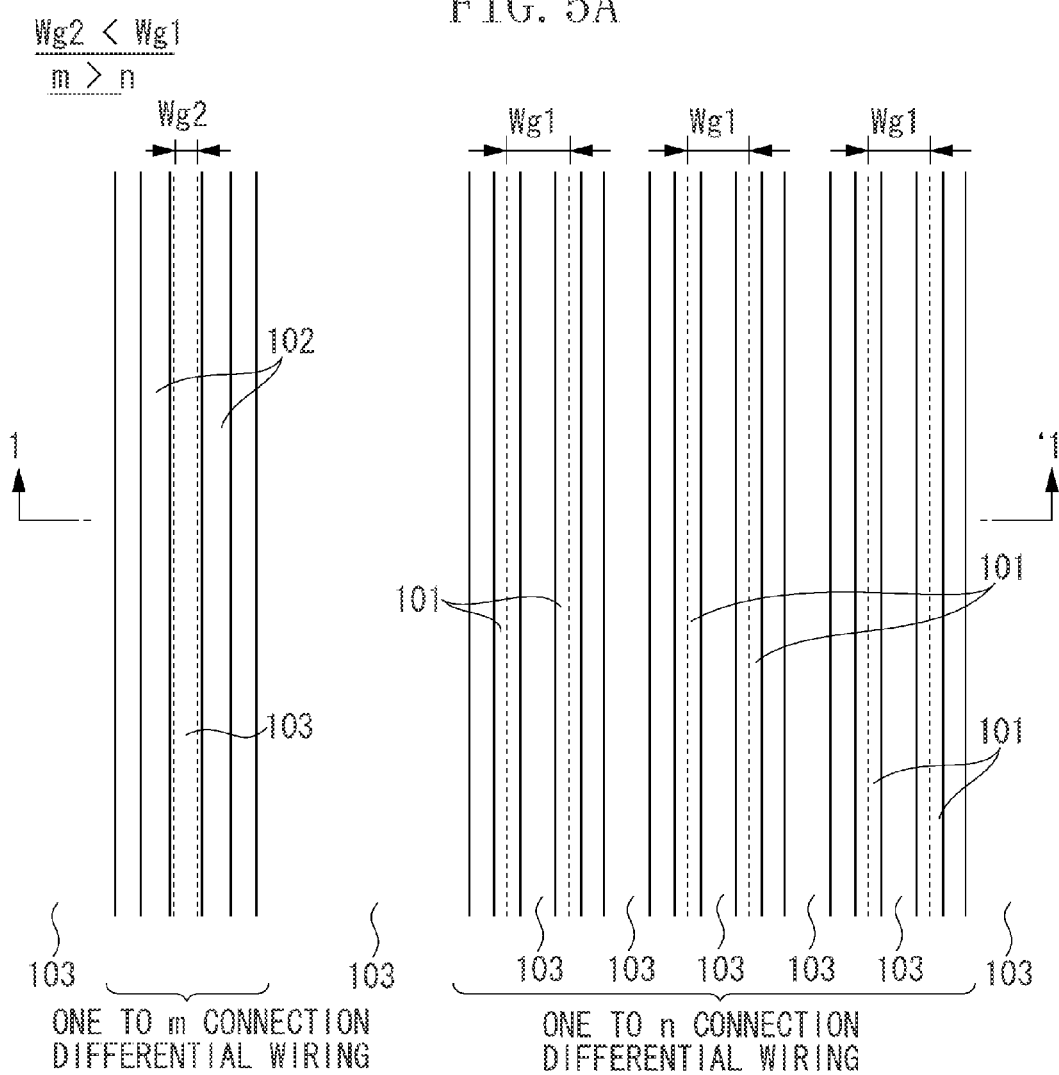
FIGS. 5A and 5B illustrate wiring of a printed wiring board according to a third exemplary embodiment.
Figure 5B:
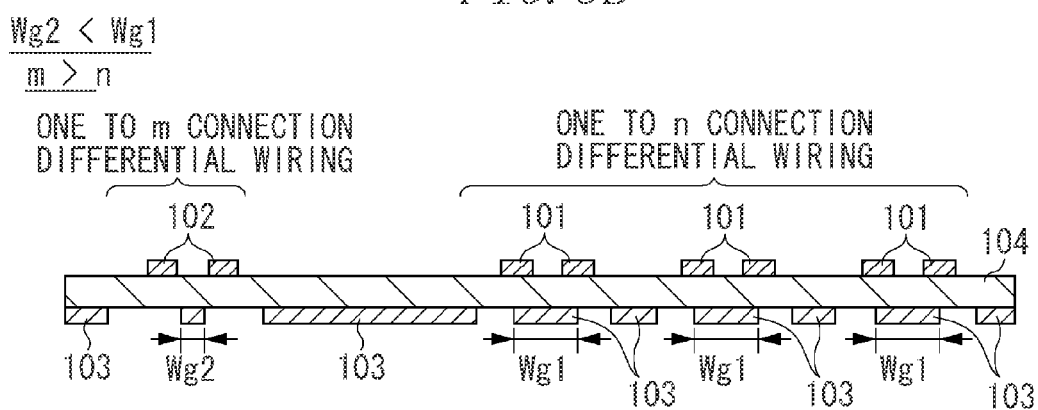

FIG. 5 illustrates a printed wiring board according to the third exemplary embodiment. FIG. 5A illustrates an expanded plane view and FIG. 5B is a cross sectional view taken along a dotted line 1-'1 in FIG. 5A. Similarly as the first exemplary embodiment and the second exemplary embodiment, in the third exemplary embodiment, the differential impedance of the differential signal line having the 1 to m connection form is set to be higher than the differential impedance of the differential signal line having the 1 to n connection form. Descriptions of similar parts of the first exemplary embodiment and the second exemplary embodiment will be omitted and only different points will be described.

In the third exemplary embodiment, as illustrated in FIG. 5B, a width Wg 2 of a ground line (a second ground line) 103 is set to be smaller than a width Wg 1 of a ground line (a first ground line) 103. The second ground line 103 is provided, opposing the differential signal line 102 at an opposite position (an area) across the insulation layer 104. The first ground line 103 is provided, opposing the differential signal line 101 at an opposite position (an area) across the insulation layer 104. Similarly to the differential signal lines 101 and 102, these ground lines 103 also connect terminals contained in a terminal array (the first terminal array) 408 to terminals contained in a terminal array (the second terminal array) 407.

When the width of the ground line 103 becomes small, capacitance per unit length C decreases because electric coupling strength between a signal line and a ground line becomes weak. The characteristic impedance $Z_O$ of a single end becomes high as seen from the formula (1). By setting Wg2<Wg1, the characteristic impedance $Z_O$ of a single end of the signal line 102 having the 1 to m connection form can be set higher compared with the characteristic impedance $Z_O$ of a single end of the signal line 101 having the 1 to n connection form. Accordingly, as seen from the formula (2), since the differential impedance $Z_{diff}$ is determined by $Z_O$, the differential impedance $Z_{diff}$ of the signal line 102 having the 1 to m connection form can be set higher than the differential impedance $Z_{diff}$ of the signal line 101 having the 1 to n connection form.

Having the aforementioned configuration, reflection of a signal and distortion of a wave form can be suppressed.

Figure 6A:
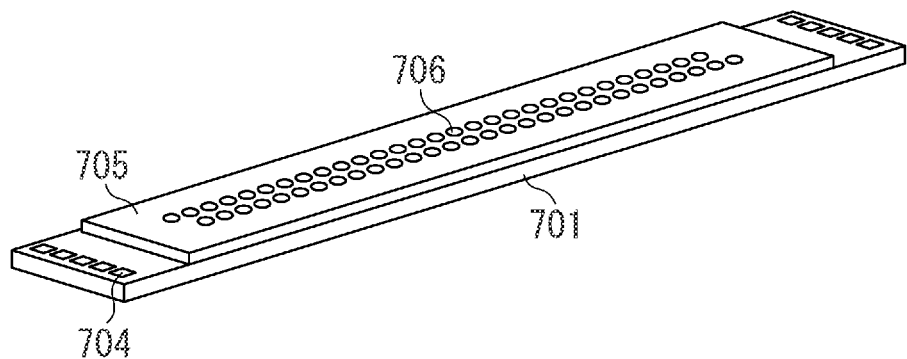
FIGS. 6A and 6B illustrate a recording element board.
Figure 6B:
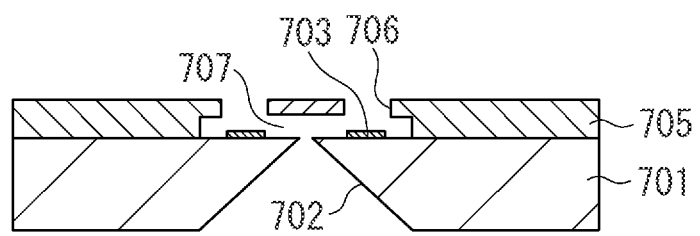

As an example of the element substrate 401, a recording element substrate driving a recording element as a driving element is described. FIG. 6 illustrates the recording element substrate 401. As illustrated in FIG. 6A, terminals 704 for electrically connecting to the printed wiring board 403 are formed at both ends in the longitudinal direction of the recording element substrate 401. Further, two discharge port arrays including a plurality of discharge ports are formed. FIG. 6B is a cross sectional view of the recording element substrate 401. An ink supply port 702 having a long groove shape is formed with a high accuracy in a silicon substrate 701 having a 0.5 to 0.625 mm thickness by wet etching or dry etching. On a surface of the silicon substrate, a plurality of heaters (recording elements) 703, which are recording elements, and drive circuits for driving the heater 703 are formed by a film forming technique. Further, a discharge port forming member 705 which is made of a resin material is formed on the silicon substrate 701 and a plurality of discharge ports 706 corresponding to the heaters 703 and an ink storage room 707 communicating to the discharge ports are formed by a photolithography technique.

Figure 7:
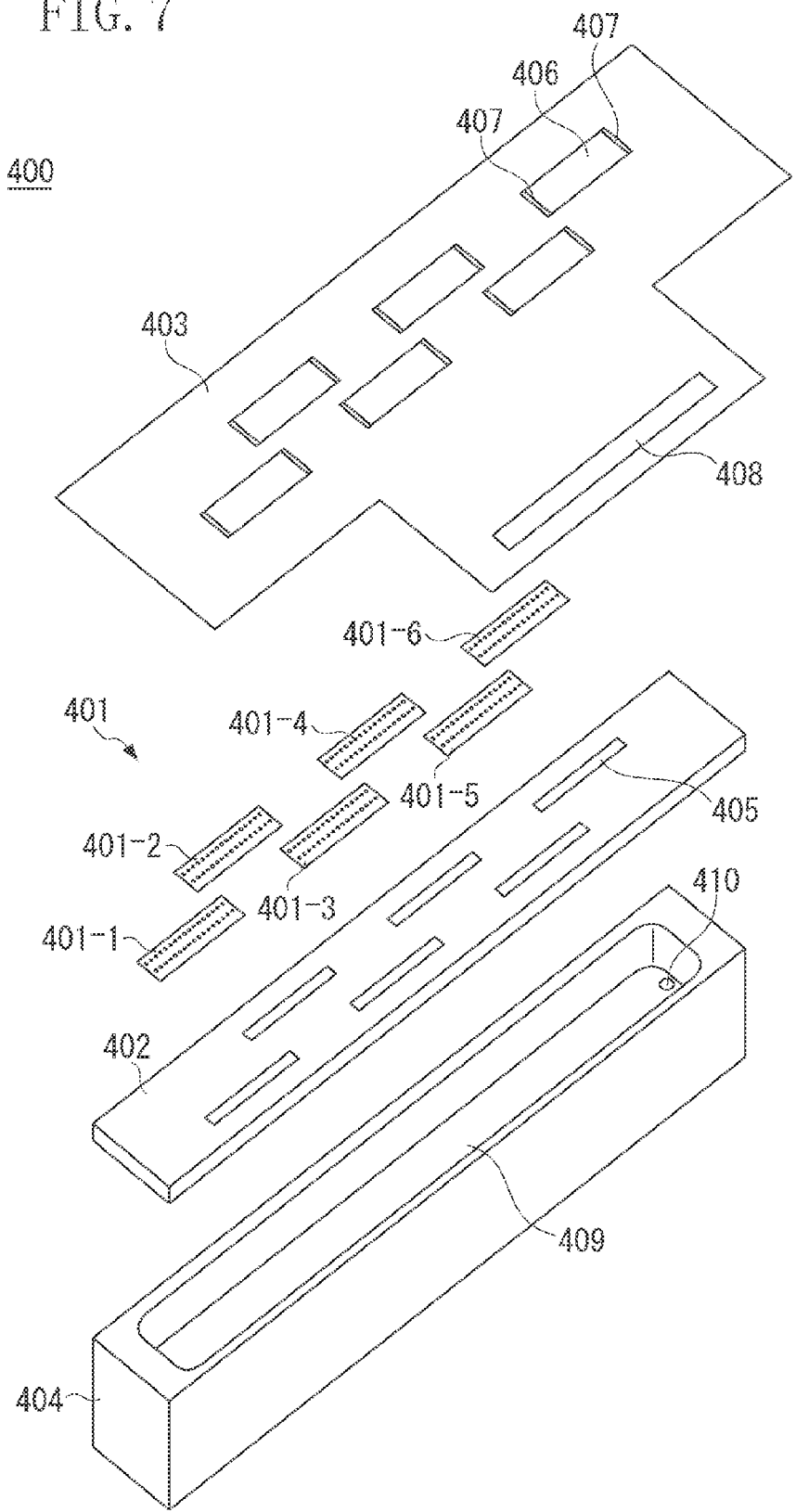
FIG. 7 is a decomposition perspective view of a recording head.

As one example of a device, a recording head will be described. FIG. 7 is a decomposition perspective view of a recording head 400. The recording head 400 includes the recording element substrates 401, a supporting member 402, the printed wiring board 403, and an ink supply member 404.

In the recording head 400, six recording elements 401 are arranged in a staggered manner. In addition, a length of a recording head can be prolonged by increasing the number of the recording element substrates 401.

The supporting member 402 is a member for supporting and fixing the recording element substrate 401 and, for example, is formed by alumina (Al2O3) having a 0.5 to 1 mm thickness. The material of the supporting member is not limited to alumina. A material having a liner expansion coefficient equivalent to the recording element substrate, and high rigidity can be used. As such materials, for example, silicon (Si), aluminum nitride (AlN), silicon nitride (Si3N4), silicon carbide (SiC), molybdenum (Mo), and tungsten (W) can be used.

In the supporting member 402, the ink supply ports 405 is formed at positions corresponding to the ink supply port 702 of the recording element substrate 401, and the recording element 401 is attached and fixed with high positional accuracy to the supporting member 402 by a first adhesive.

The printed wiring board 403 is a member for transmitting and supplying electric signals and power voltage for discharging ink. As for the printed wiring board 403, for example, a flexible substrate having a double layered structure on which wiring is formed on the both sides and which surface is covered by a protective film, is used.

In the printed wiring board 403, as illustrated in FIG. 7, openings 406 for mounting the recording element substrate 401 are formed. The printed wiring board 403 has terminal arrays 407 including inner connection terminals corresponding to the terminals 704 of the element substrate 401 and a terminal array 408, for example, a connector, including terminals for receiving electric signals from a control substrate.

The printed wiring board 403 is attached and fixed, by a second adhesive, to the same surface of the supporting member 402 to which the recording element substrate 401 is attached. Further, a space between the opening 406 and the recording element substrate 401 is sealed by a sealing agent. Further, the inner connection terminal 407 of the printed wiring board 403 and the terminal 704 of the recording element substrate 401 are electrically connected by a wire bonding technique using a gold wire and an electric connection part is sealed by a sealing agent. Furthermore, the printed wiring board 403 is bent and fixed at both side surfaces of the supporting member 402, to easily carry out an electric connection.

The ink supply member 404 is a part for supplying ink from an ink tank to the element substrate 401, and is formed, for example, by an injection molding method using a resin. In the ink supply member 404, the ink storage room 409 for supplying ink to a plurality of the recording element substrate 401 is formed. In the ink storage room 409, ink is introduced from the opening 410 through an ink supply tube connected with an ink tank. The ink supply member 404 is bonded with the supporting member 402.

As a postscript, as a recording apparatus mounted with the recording head, there is a recording apparatus of a serial type which performs recording by scanning with the recording head in a direction intersecting with an arrangement direction of the recording elements. As for the other type of a recording apparatus, there is an apparatus in which the recording head is fixed and a recoding medium, for example, a recording sheet, is conveyed in a direction intersecting with an arrangement direction of the recording elements.

Other Embodiments

The present invention has been described according to first to third exemplary embodiments, but it is not limited to these embodiments. For example, the number of an element substrate provided on the printed wiring board 401 is six in the aforementioned exemplary embodiments. However, the number is not limited to six but can be four, eight, or ten. Further, as for a relationship of the number of terminals, the aforementioned connection form is 1 to 1 (n is 1) and 1 to 6 (m is 6). However, the relationship is not limited to these and other combinations are also possible, for example, a connection form may be 1 to 3 (n is 3) or 1 to six (m is 6).

Further, as for a driving element, a light emitting element, such as a light emitting diode (LED) and a diode, or a sensor element, such as a complementary metal oxide semiconductor (CMOS) sensor, may also be used. Furthermore, as an example of the device, the present invention can also be applied to an image reading unit for reading an image and a display unit for displaying an image.

While the present invention has been described with reference to exemplary embodiments, it is to be understood that the invention is not limited to the disclosed exemplary embodiments. The scope of the following claims is to be accorded the broadest interpretation so as to encompass all modifications, equivalent structures, and functions.

This application claims priority from Japanese Patent Application No. 2010-112329 filed May 14, 2010, which is hereby incorporated by reference herein in its entirety.

What is claimed is:

1. A printed wiring board comprising:
   a first terminal array and a second terminal array comprising a plurality of terminals respectively;
   a first differential signal line connecting a first terminal of the first terminal array to a predetermined number of terminals including a second terminal of the second terminal array;

a second differential signal line connecting a third terminal of the first terminal array to a number of terminals including a fourth terminal of the second terminal array, which is bigger than the predetermined number of terminals;

wherein at least one of a line width and a line interval of one pair signal lines configuring the first differential signal line and the second differential signal line is determined so that differential impedance of the second differential signal line becomes higher compared with differential impedance of the first differential signal line.

2. The printed wiring board according to claim 1, wherein a wiring interval of the signal line configuring the second differential signal line is larger than an interval of the signal line configuring the first differential signal line.

3. The printed wiring board according to claim 1, wherein a wiring width of the signal line configuring the second differential signal line is smaller than a wiring width of the signal line configuring the first differential signal line.

4. The printed wiring board according to claim 1, further comprising:

an insulation layer;

a first ground line arranged opposing an area, in which the first differential signal line is arranged, across the insulation layer, and a second ground line arranged opposing an area, in which the second differential signal line is arranged, across the insulation layer wherein, sizes of the first ground line and the second ground line are determined so that differential impedance of the second differential signal line becomes higher compared with differential impedance of the first differential signal line.

5. The printed wiring board according to claim 4, wherein a wiring width of the first ground line is larger than a wiring width of the second ground line.

6. The printed wiring board according to claim 1, wherein the first terminal array connects to an element substrate for driving a driving element and the second terminal array inputs a signal from a control substrate for controlling the element substrate.

7. A device comprising the printed wiring board according to claim 6.

* * * * *